US011990468B2

(12) United States Patent
Solomko et al.

(10) Patent No.: US 11,990,468 B2
(45) Date of Patent: May 21, 2024

(54) MOSFET-BASED RF SWITCH WITH IMPROVED ESD ROBUSTNESS

(71) Applicant: Infineon Technologies AG, Neubiberg (DE)

(72) Inventors: Valentyn Solomko, Munich (DE); Semen Syroiezhin, Erlangen (DE); Mirko Scholz, Ottobrunn (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 17/821,615

(22) Filed: Aug. 23, 2022

(65) Prior Publication Data
US 2024/0072040 A1     Feb. 29, 2024

(51) Int. Cl.
*H01L 27/02*     (2006.01)
*H02H 9/04*      (2006.01)

(52) U.S. Cl.
CPC ...... *H01L 27/0288* (2013.01); *H01L 27/0255* (2013.01); *H01L 27/0266* (2013.01); *H02H 9/04* (2013.01)

(58) Field of Classification Search
CPC .. H03K 17/10; H03K 17/0412; H03K 17/687; H03K 17/161; H01L 25/065; H01L 25/0657; H01L 27/0288; H01L 27/0266; H01L 27/07; H02H 9/02
USPC ........................................ 361/56, 91.1, 111
See application file for complete search history.

(56) References Cited

U.S. PATENT DOCUMENTS

| | | | | |
|---|---|---|---|---|
| 10,886,911 | B2* | 1/2021 | Willard | H01L 27/1203 |
| 2013/0215808 | A1* | 8/2013 | Muthukrishnan | H02H 9/045 |
| | | | | 370/297 |
| 2014/0009211 | A1 | 1/2014 | Madan et al. | |
| 2014/0091858 | A1* | 4/2014 | Peachey | G05F 3/16 |
| | | | | 327/537 |
| 2019/0140687 | A1 | 5/2019 | Tombak et al. | |
| 2020/0014380 | A1 | 1/2020 | Jo et al. | |

FOREIGN PATENT DOCUMENTS

WO     2018009053 A1     1/2018

OTHER PUBLICATIONS

Rigato, Matteo, et al., "Analysis of ESD Behavior of Stacked nMOSFET RF Switches in Bulk Technology," in IEEE Transactions on Electron Devices, vol. 65, No. 3, Mar. 2018, pp. 829-837, doi: 10.1109/TED.2018.2789941.

* cited by examiner

*Primary Examiner* — Danny Nguyen
(74) *Attorney, Agent, or Firm* — Slater Matsil, LLP (57) ABSTRACT

An RF switch device includes transistors coupled in series forming an RF conductive current path; a first resistive bias network forming a DC conductive bias path between gate nodes of the plurality of transistors; and a first ESD bias component coupled between the RF conductive current path and the first resistive bias network, wherein the first ESD bias component provides a DC conductive path between the RF conductive current path of the RF switch device and the first resistive bias network during an ESD event.

19 Claims, 11 Drawing Sheets

FIG. 13

# MOSFET-BASED RF SWITCH WITH IMPROVED ESD ROBUSTNESS

TECHNICAL FIELD

The present invention relates generally to a MOSFET-based Radio Frequency (RF) switch with improved Electro-Static Discharge (ESD) robustness, and, in particular embodiments, to a corresponding method.

BACKGROUND

Figure 1:
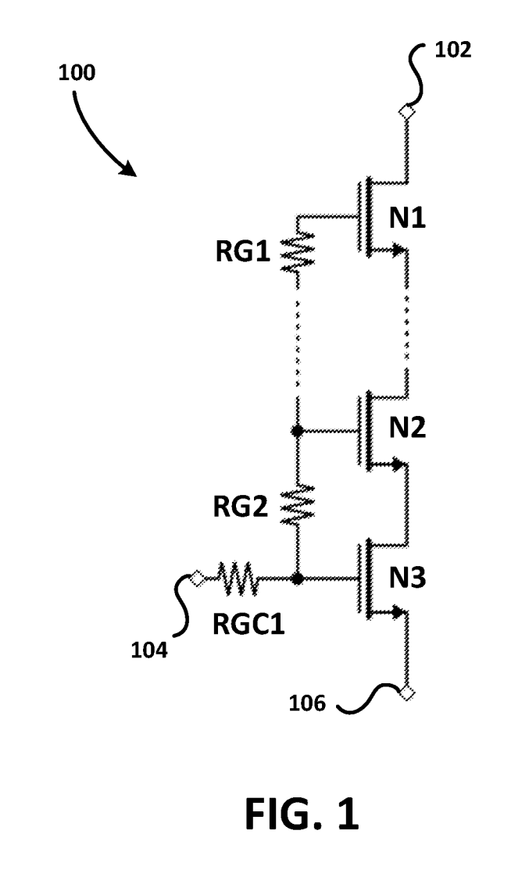
FIG. 1 is a schematic diagram of an exemplary stacked MOSFET RF switch 100.

FIG. 1 is a schematic diagram of an exemplary stacked MOSFET RF switch 100. The circuit of the stacked MOSFET RF switch 100 comprises a plurality of transistors N1, N2, and N3 in a stacked configuration between a first node 102 and a second node 106. The circuit of the stacked MOSFET RF switch 100 also comprises a high-ohmic resistive biasing network coupled to the gate terminals of transistors N1, N2, and N3, including resistors RG1, RG2, and RGC1. Resistor RGC1 is coupled to a third node 104 for receiving a control voltage for controlling the state of the switch. During an ESD voltage pulse the $C_{gs}$ and $C_{gd}$ capacitors of transistors N1, N2, and N3 are charged. When the gate-source voltage of all transistors in stack reaches the threshold voltage, the stacked chain starts conducting current, thus discharging the node at which ESD pulse is applied. With a low $R_g C_{gs}$ time constant or a slow ESD pulse, the switch may not sustain the required conductive state for a complete discharge phase of the node and some transistors in the stack may be exposed to excessive ESD voltage and be damaged.

SUMMARY

According to an embodiment, an RF switch device comprises a plurality of transistors coupled in series forming an RF conductive current path; a first resistive bias network forming a DC conductive bias path between gate nodes of the plurality of transistors; and a first ESD bias component coupled between the RF conductive current path and the first resistive bias network, wherein the first ESD bias component is configured to provide a DC conductive path between the RF conductive current path of the RF switch device and the first resistive bias network during an ESD event.

According to an embodiment, an RF switch comprises a plurality of transistors coupled in series forming an RF conductive current path between a first node and a second node; and an ESD and biasing network coupled to the first node, the second node, and to a plurality of control nodes of the plurality of transistors in the RF conductive current path, wherein the ESD and biasing network is configured to provide a DC conductive path between the first node and the second node during an ESD event, and to block a DC conductive path between the first node and the second node in an absence of an ESD event.

According to an embodiment, a method of operating an RF switch comprising a plurality of transistors coupled between a first node and a second node comprises biasing a control node of each transistor in the plurality of transistors with a biasing network coupled between the first node and the second node; establishing a DC conductive path through the biasing network during an ESD event; and blocking the DC conductive path through the biasing network in an absence of the ESD event.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the following detailed description, reference is made to the accompanying drawings, which form a part hereof and in which are shown byway of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same or similar elements have been designated by corresponding references in the different drawings if not stated otherwise.

According to embodiments, a stacked MOSFET RF switch structure is described and shown with improved robustness against ESD events.

Figure 2:
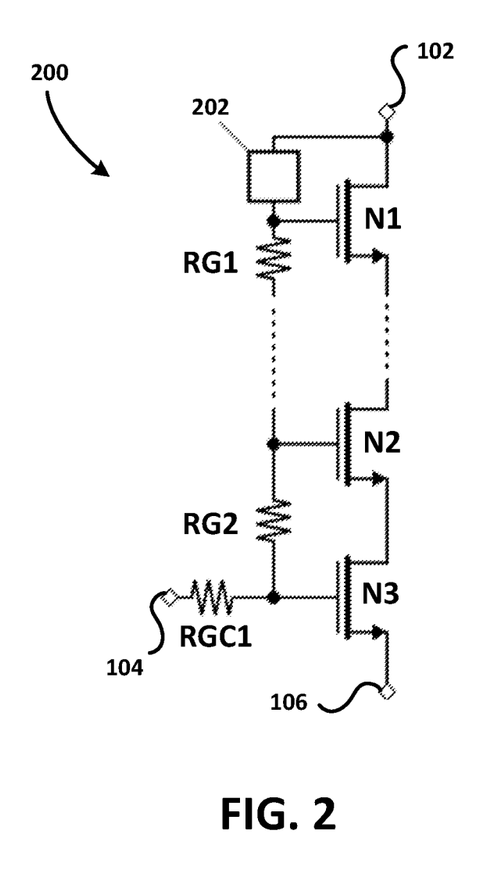
FIG. 2 is a schematic diagram of an RF switch with improved ESD robustness including an ESD protection circuit, according to an embodiment.

FIG. 2 is a schematic diagram of an RF switch 200 with improved ESD robustness including an ESD protection circuit 202, in addition to the previously described RF switch components, according to an embodiment. The ESD robustness improvement is attained by introducing a DC path between the switch node exposed to ESD voltage (for example first node 102) and the resistive gate bias network of the MOS transistors in the stack. Specifically, ESD protection circuit 202 is coupled between first node 102 and a first end of resistor RG1 (which is also the gate node of transistor N1). Thus, FIG. 2 shows an RF switch 200 comprising a plurality of MOSFETs including transistors N1, N2, and N3 coupled in series to create an RF conductive current path through the channels of the transistors, and a gate resistive bias network including resistors RG1, RG2, and RGC1 arranged to provide a DC conductive bias path between the gate terminals of the MOSFETs in the stack of the RF switch 200. While only three transistors and three resistors are shown, it will be evident to those skilled in the art that any number of transistors and resistors can be used. In some switches as many as twenty or more transistors and resistors can be used depending on the voltage specifications of a particular application. RF switch 200 also includes an ESD protection circuit 202 (which can also be referred to as an ESD bias network) coupled between the RF conductive current path of the RF switch formed by transistors N1, N2, and N3, and the gate resistive bias network formed by resistors RG1, RG2, and RGC1, wherein the ESD bias network is configured to provide a DC conductive path between the RF conductive current path of the switch and the gate resistive bias network during an ESD event.

Figure 3:
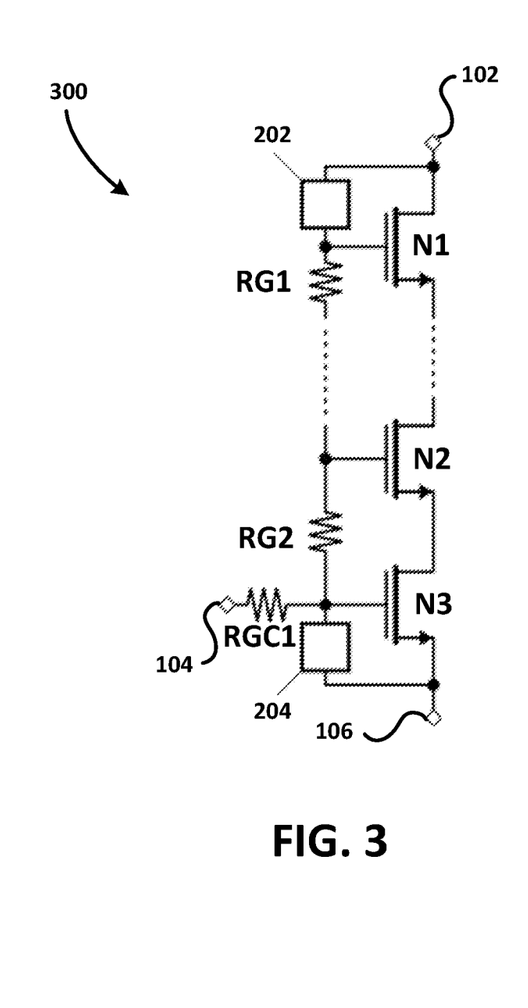
FIG. 3 is a schematic diagram of an RF switch with improved ESD robustness including first and second ESD protection circuits, according to an embodiment.

FIG. 3 is a schematic diagram of an RF switch 300 with improved ESD robustness including a first ESD protection circuit 202 and second ESD protection circuit 204, according to an embodiment. RF switch 300 includes all of the components shown in RF switch 200 of FIG. 2, but also includes the second ESD protection circuit 204. The second ESD protection circuit 204 is coupled between the second node 106 or RF switch 300 (also the source of transistor N3) and the junction of resistors RGC1 and RG2 (which is also the gate node of transistor N3). Thus, two ESD bias networks may be coupled to both terminals of the RF switch 300 and gate resistive bias network as is shown in FIG. 3. The circuit structure shown in FIG. 3 thus allows handling ESD events from both poles of the RF switch (first node 102 and second node 106).

Figure 4:
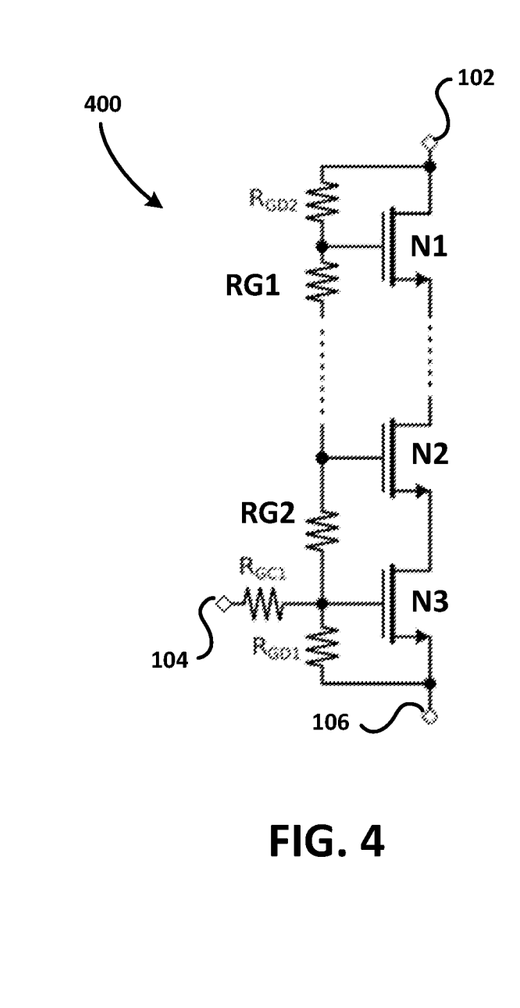
FIG. 4 is a schematic diagram of an RF switch with improved ESD robustness including first and second resistive ESD protection circuits, according to another embodiment.

FIG. 4 is a schematic diagram of an RF switch 400 with improved ESD robustness including first and second resistive ESD protection circuits, according to another embodiment. The ESD protection circuits (which may also be referred to as an ESD bias network) may be implemented in the form of a resistor as is shown in FIG. 4. For example, first ESD protection circuit 202 can be implemented as resistor $R_{GD2}$ and second ESD protection circuit 204 can be implemented as resistor $R_{GD1}$, in an embodiment. Resistor $R_{GD2}$ provides a DC conductive path that lifts up the gate voltage at the top transistor (transistor N1) in the stack, keeping the whole stack in the ON state during an ESD event at the first node 102. Resistor RGD1 provides a similar function if the ESD event occurs at the second node 106. The value of the resistors in the ESD bias networks may be comparable to the resistors in the gate bias network, typically in the range between several kOhms and several hundreds of kOhms. The control voltage for RF switch 400 is received at a lowermost point of the gate bias network (the third node 104) as is shown in FIG. 4.

Figure 5:
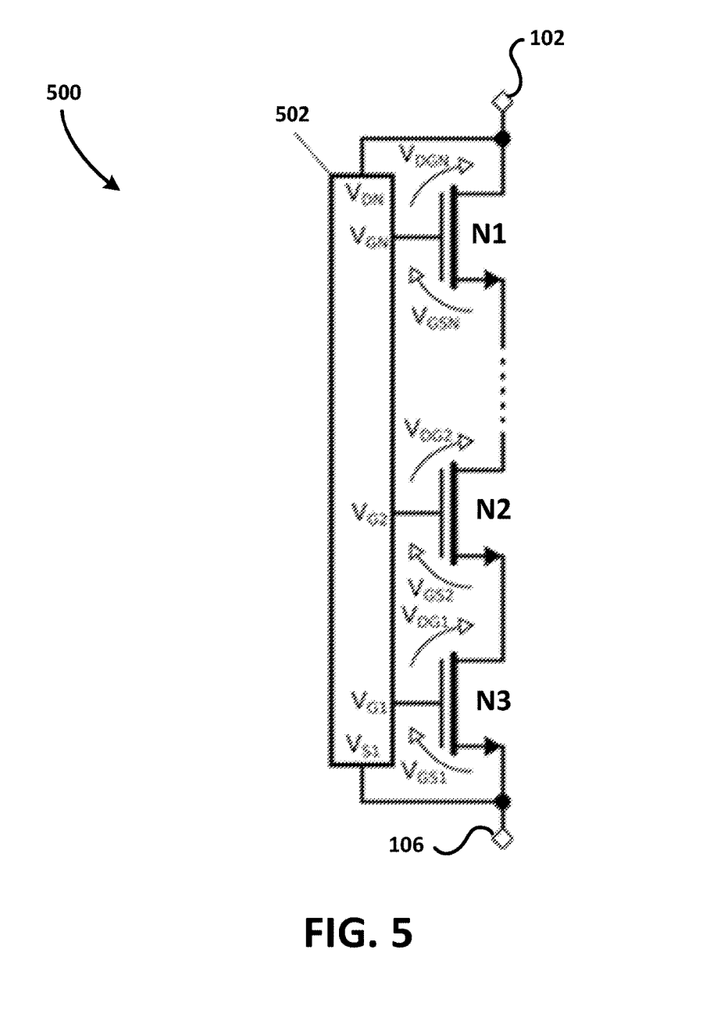
FIG. 5 is a schematic diagram of an RF switch with improved ESD robustness including a combined gate bias resistive network and an ESD bias network, according to an embodiment.

FIG. 5 is a schematic diagram of an RF switch 500 with improved ESD robustness including a combined gate bias resistive network and an ESD bias network, according to an embodiment. A generalized representation of the RF switch with improved ESD robustness is shown in FIG. 5. The gate bias resistive network together with the ESD bias network are assembled into a single circuit block 502, which is coupled to the gates of MOSFETs (transistors N1, N2, and N3) in the stack and RF feed terminals of the switch (first node 102 and second node 106). The ESD bias network is configured to provide a DC path between terminals $V_{S1}$, $V_{G1}$, ..., $V_{Gi}$, ... $V_{GN}$, and $V_{DN}$ during an ESD event. Particularly, the ESD bias network in FIG. 4 can be configured such that during the complete duration of the ESD discharge event none of the voltages $V_{GSi}$ and $V_{GSi}$ exceed the critical voltage level that can cause permanent damage to any transistor in stack or overstress the transistor and cause reliability issues during the switch operation over required lifetime:

$$V_{GSi} < V_{damage}, V_{DGi} < V_{damage}, \qquad [1]$$

wherein $V_{damage}$ is typically a voltage in the range of transistor gate oxide breakdown voltage, for state-of-art technologies in the range of 3V to 5V.

In order to provide a fast discharge of the ESD node, all transistors in the stack operate in the saturation mode, which is achieved by keeping the gate-source voltage above the threshold voltage level. The ESD bias network together with the gate bias network (single circuit block 502) can be optimized to achieve the following voltage distribution along the stack:

$$V_{GS1} \approx V_{DG1}, V_{GS2} \approx V_{DG2}, \ldots V_{GSN} \approx V_{DGN}. \qquad [2]$$

when the ESD node is discharged to the level that the gate-source voltage cannot be sustained beyond the threshold voltage, then the condition of equation [1] and possibly the condition of equation [2] is satisfied to prevent any damage to the MOSFETs in stack until the ESD node is completely discharged.

Figure 6A:
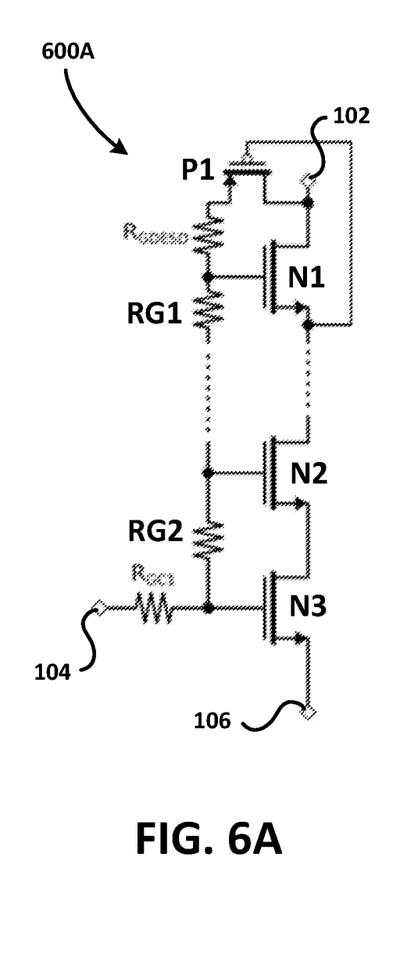
FIG. 6A is a schematic diagram of an RF switch with improved ESD robustness including a PMOS transistor in series with the ESD protection circuit, according to a first embodiment.

FIG. 6A is a schematic diagram of an RF switch 600A with improved ESD robustness including a PMOS transistor P1 in series with the ESD protection circuit (resistor $R_{GDESD}$), according to a first embodiment. The source of PMOS transistor P1 is coupled to a first node of resistor $R_{GDESD}$, the gate of PMOS transistor P1 is coupled to the source of transistor N1, and the drain of PMOS transistor P1 is coupled to first node 102 of RF switch 600A.

In an embodiment of RF switch 600A, the ESD bias network (resistor $R_{GDESD}$) establishes a DC path between the switch feed (first node 102) and the gate of the topmost transistor (transistor N1) as is shown in FIG. 6A. PMOS transistor P1 with resistor $R_{GDESD}$ in series with the PMOS channel of the transistor is added to the RF switch for ESD robustness. Upon the reception of a positive ESD pulse between the topmost and bottommost poles (first node 102 and second node 106) of RF switch 600A, the PMOS transistor P1 enters into an ON state and establishes a DC path. During RF operation the gates of the NMOS switch transistors (transistors N1, N2, and N3) are biased by a negative voltage, which brings the PMOS transistor P1 into an OFF state. The resistor $R_{GDESD}$ in series to the PMOS channel serves to reduce possible linearity degradation caused by the PMOS transistor P1 during RF operation.

Figure 6B:
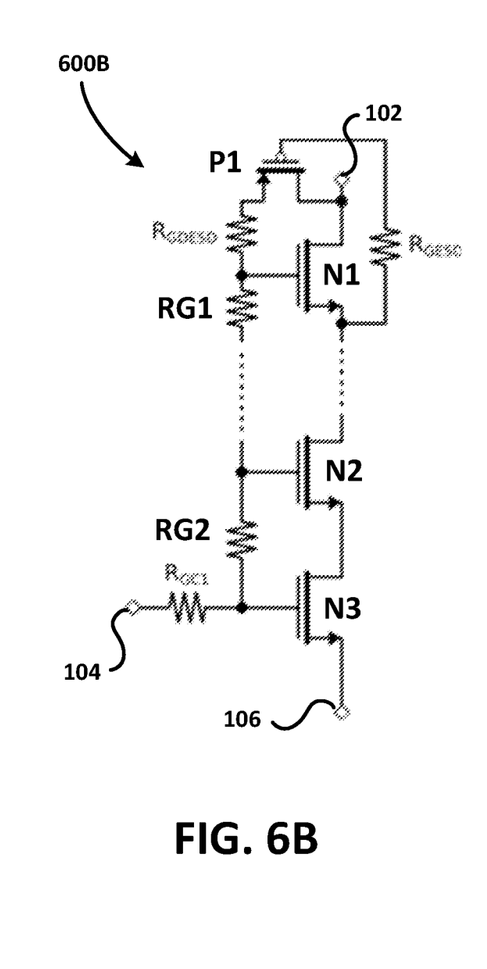
FIG. 6B is a schematic diagram of an RF switch with improved ESD robustness including a PMOS transistor in series with the ESD protection circuit, according to a second embodiment.

FIG. 6B is a schematic diagram of an RF switch 600B with improved ESD robustness including a PMOS transistor P1 in series with the ESD protection circuit (resistor $R_{GDESD}$), according to a second embodiment. The source of PMOS transistor P1 is coupled to a first node of resistor $R_{GDESD}$, the gate of PMOS transistor P1 is coupled to the source of transistor N1 through resistor $R_{GESD}$, and the drain of PMOS transistor P1 is coupled to first node 102 of RF switch 600B. Resistor $R_{GESD}$ is provided to improve the linearity of the RF switch 600B by minimizing the harmonic distortion generated by PMOS device P1, in an embodiment.

Figure 6C:
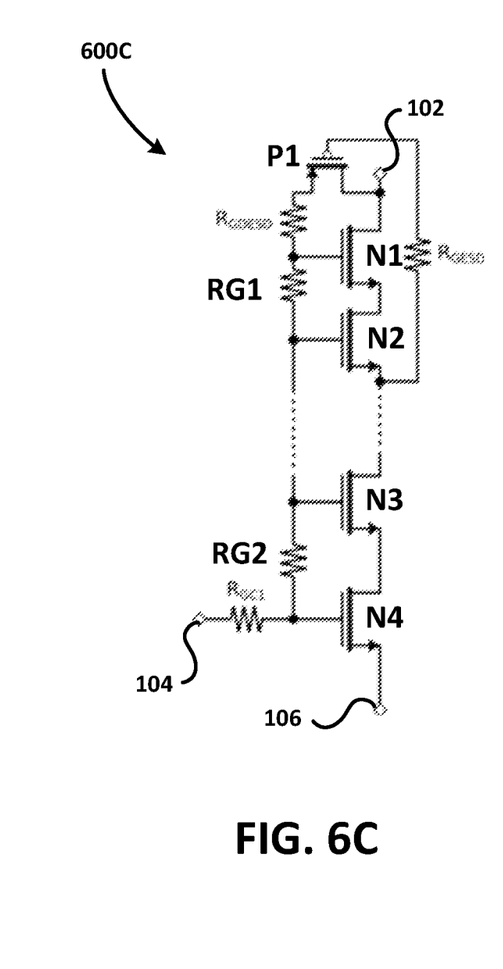
FIG. 6C is a schematic diagram of an RF switch with improved ESD robustness including a PMOS transistor in series with the ESD protection circuit, according to a third embodiment.

FIG. 6C is a schematic diagram of an RF switch 600C with improved ESD robustness including a PMOS transistor P1 in series with the ESD protection circuit (resistor $R_{GDESD}$), according to a third embodiment. The source of PMOS transistor P1 is coupled to a first node of resistor $R_{GDESD}$, the gate of PMOS transistor P1 is coupled to the source of transistor N2 through resistor $R_{GESD}$, and the drain of PMOS transistor P1 is coupled to first node 102 of RF switch 600C. In the embodiment of FIG. 6C the gate of the PMOS transistor P1 is coupled to an arbitrary drain-source node in the stack of transistors via the $R_{GESD}$ resistor. Such connection increases the gate-source voltage of the PMOS transistor P1 during an ESD event, lowering the resistance of the DC path between the feed (first node 102) and the gate of the switch transistor.

All of the RF switches shown in FIGS. 6A, 6B, and 6C are capable of operating in the OFF-state only for the reason that in the ON state the PMOS device P1 cannot be kept in the cut-off region, which would shift the desired gate-source operating point of the RF switch.

Figure 7A:
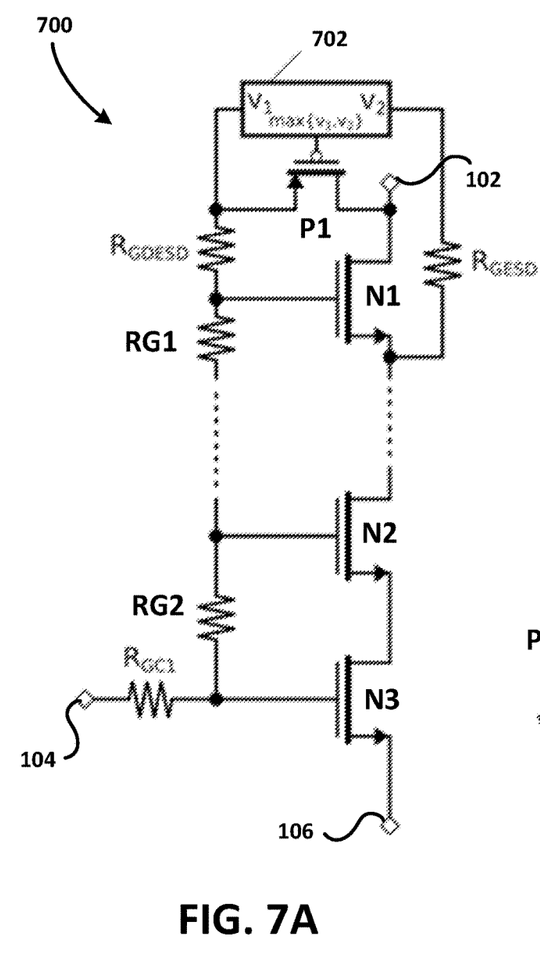
FIG. 7A is a schematic diagram of an RF switch with improved ESD robustness including a maximum voltage selection network, according to an embodiment.

FIG. 7A is a schematic diagram of an RF switch 700 with improved ESD robustness including a maximum voltage selection network 702, according to an embodiment. In the embodiment shown in FIG. 7A, a first input of the maximum voltage selection network 702 is coupled to the source of PMOS transistor P1 and a first node of resistor $R_{GDESD}$, previously described with respect to the RF switches shown in FIGS. 6A, 6B, and 6C. The second input of the maximum voltage selection network 702 is coupled to a first node of resistor RGESD, previously described with respect to the RF switches shown in FIGS. 6B and 6C. The output of the maximum voltage selection network 702 is coupled the gate of PMOS transistor P1.

The embodiment shown in FIG. 7A adds additional features to the RF switch embodiments shown in FIGS. 6A, 6B, and 6C. The maximum voltage selection network 702 outputs the maximum of two voltages applied at its input: either $V_1$ (at the first input) or $V_2$ (at the second input). When the RF switch 700 operates in the OFF state, the DC voltage component at the gate bias network ($V_1$) is below the DC voltage at the drain-source nodes ($V_2$), such that the gate of PMOS transistor P1 is coupled to the drain-source nodes and the circuit of RF switch 700 functionally transforms to the circuit of RF switch 600B shown in FIG. 6B. In the ON state, the maximum voltage selection network 702 selects voltage $V_1$ and applies this voltage to the gate of the PMOS transistor P1, keeping the transistor in the OFF mode during operation. Therefore, the embodiment of RF switch 700 shown in FIG. 7 can operate in both OFF and ON states. During an ESD event, the operation of RF switch 700 is similar to the RF switch circuits shown in FIGS. 6A, 6B, and 6C.

Figure 7B:
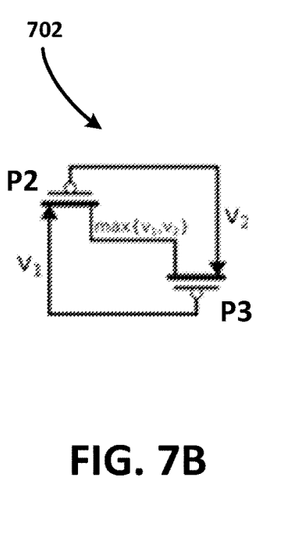
FIG. 7B is a schematic diagram of the maximum voltage selection network 702 of FIG. 7A.

FIG. 7B is a schematic diagram of an example implementation of the maximum voltage selection network 702 of FIG. 7A. The first input ($V_1$) of the maximum voltage selection network 702 is coupled to a source of PMOS transistor P2, and to a gate of PMOS transistor P3. The second input ($V_2$) of the maximum voltage selection network 702 is coupled to a source of PMOS transistor P3, and to a gate of PMOS transistor P2. The output of the maximum voltage selection network 702 is defined by the equation max($V_1$, $V_2$) and is coupled to the drain of PMOS transistor P2 and to the drain of PMOS transistor P3. Other implementations of the maximum voltage selection network can also be used.

Figures 8A, 8B, 8C:
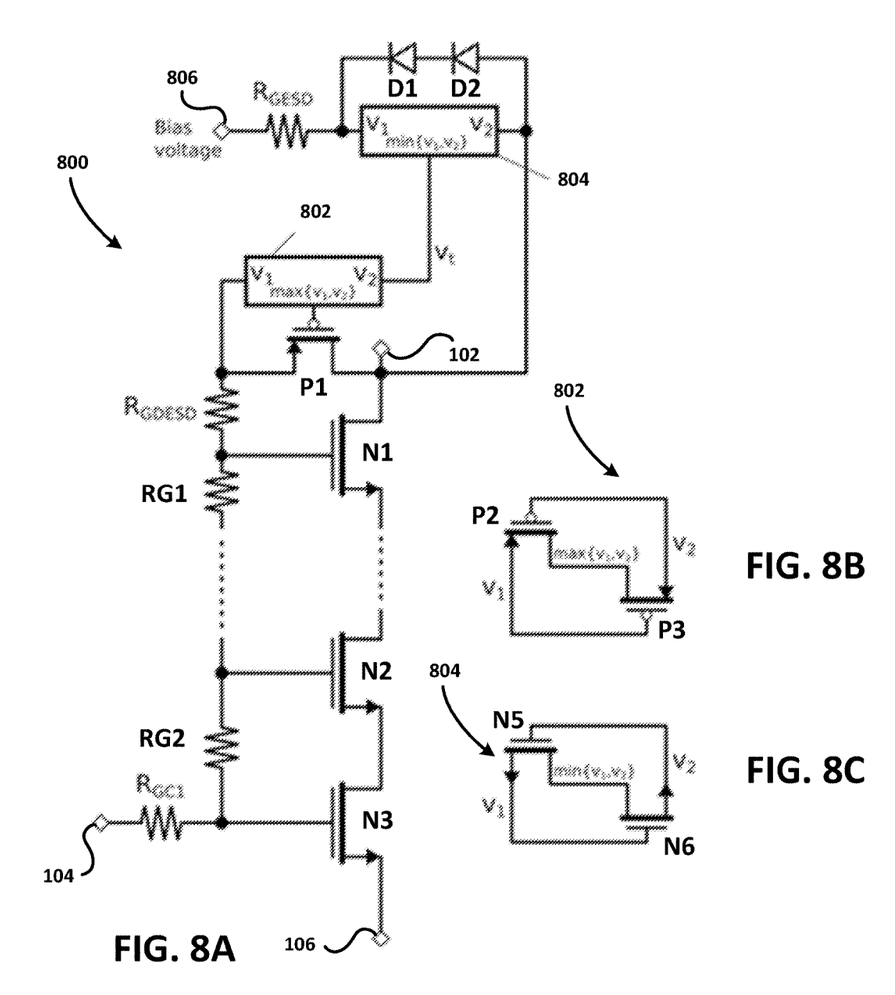
FIG. 8A is a schematic diagram of an RF switch with improved ESD robustness including a maximum voltage selection network and a minimum voltage selection network, according to an embodiment.
FIG. 8B is a schematic diagram of the maximum voltage selection network of FIG. 8A.
FIG. 8C is a schematic diagram of the minimum voltage selection network of FIG. 8A.

FIG. 8A is a schematic diagram of an RF switch 800 with improved ESD robustness including a maximum voltage selection network 802 and a minimum voltage selection network 804, according to an embodiment. The maximum voltage circuit 802 has a first input ($V_1$) coupled to the first ESD bias component (resistor $R_{GESD}$, previously described), a second input ($V_2$), and an output (max($V_1$, $V_2$)) coupled to the gate of PMOS transistor P1, previously described. The minimum voltage selection circuit 804 has a first input ($V_1$) coupled to a bias voltage source 806 through resistor $R_{GESD}$, a second input ($V_2$) coupled to a first node 102 of the RF switch 800, and an output (max($V_1$, $V_2$)) coupled to the second input ($V_2$) of the maximum voltage circuit 802. In addition, first and second diodes are serially coupled together, and between the two inputs of the minimum voltage selection circuit 804. In an embodiment, the cathode of diode D1 is coupled to the first input of minimum voltage selection circuit 804, and the anode of diode D2 is coupled to the second input of minimum voltage selection circuit 804. The maximum voltage circuit 802 is configured to provide a voltage at the output that is a maximum between a voltage at the first input ($V_1$) and a voltage at the second input ($V_2$), and the minimum voltage selection circuit 804 is configured to provide a voltage at the output that is a minimum between a voltage at the first input ($V_1$) and a voltage at the second input ($V_2$).

In RF switch 800 the voltage $V_t$ is designated as the voltage common to the output of the minimum voltage selection circuit 804 and the second input of the maximum voltage circuit 802. In the case of a positive ESD voltage pulse the voltage $V_t$ approaches the voltage $2*V_d$ (wherein $V_d$ is a forward-bias voltage of one of the diodes D1 or D2) that is lower than the applied ESD pulse, making voltage $V_t$ low enough to keep PMOS transistor P1 in the ON state as required. The bias voltage source node 806 is grounded during the ESD event. During the RF operational phase the bias voltage source node is biased at a voltage greater than or equal to zero volts, resulting in voltage $V_t$ being equal to the bias source voltage, which results in the PMOS transistor P1 staying in the OFF state as required.

When a negative ESD pulse is applied to the feed terminal of the switch, for example first node 102, there is a risk of overvoltage stress across the input terminals $V_1$ and $V_2$ of the minimum voltage selection network 804 in some embodiments. This risk can be mitigated by adding a voltage clamp across inputs $V_1$ and $V_2$ of the minimum voltage selection network 804, which is described in detail below with respect to the RF switch embodiment of FIG. 9.

FIG. 8B is a schematic diagram of the maximum voltage selection network 802 of FIG. 8A and is substantially the same maximum voltage selection network 702 of FIG. 7B, previously described.

FIG. 8C is a schematic diagram of the minimum voltage selection network 804 of FIG. 8A. The first input ($V_1$) of the minimum voltage selection network 804 is coupled to a source of NMOS transistor N5, and to a gate of NMOS transistor N6. The second input ($V_2$) of the minimum voltage selection network 804 is coupled to a source of NMOS transistor N6, and to a gate of NMOS transistor N5. The output of the minimum voltage selection network 804 is defined by the equation $\min(V_1, V_2)$ and is coupled to the drain of NMOS transistor N5 and to the drain of NMOS transistor N6. Other implementations of the minimum voltage selection network can also be used.

Figure 9:
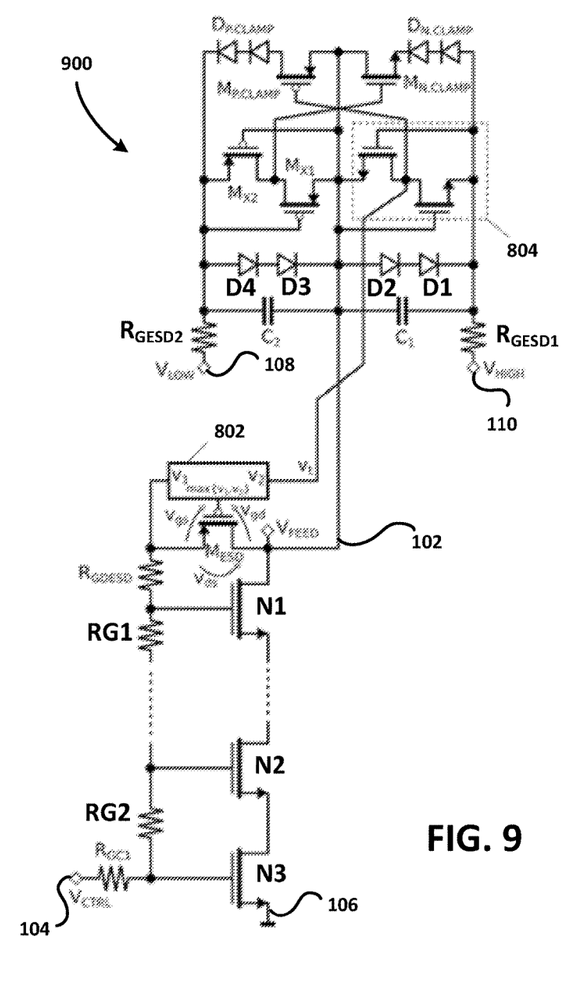
FIG. 9 is a schematic diagram of an RF switch with improved ESD robustness including a clamp circuit, according to an embodiment.

FIG. 9 is a schematic diagram of an RF switch 900 with improved ESD robustness including a clamp circuit, according to an embodiment. RF switch 900 is substantially the same as RF switch 800 shown in FIG. 8A, but the minimum voltage selection network 804 is shown at the transistor level, and the additional clamp circuit is also shown at the transistor level.

The clamp circuit is implemented by adding a diode network $D_{N,CLAMP}$, which clamps the negative voltage across the minimum selection network at $2*V_d$, where Vd is a voltage drop on a single forward biased diode. During the clamping event NMOS transistor $M_{N,CLAMP}$ is in the ON state, which is achieved by positively biasing the gate-source of NMOS transistor $M_{N,CLAMP}$ by a cross-coupled maximum selection pair of PMOS transistors $M_{X1}$ and $M_{X2}$. The rest of the clamp circuit serves the purpose of protecting NMOS transistors $M_{X1}$ and $M_{X2}$ from the positive voltage overstress. For example, the additional circuitry includes diode network $D_{P,CLAMP}$ and PMOS transistor $M_{P,CLAMP}$. Serially-coupled diodes D4 and D3 are coupled between the source of PMOS transistor MX2 and first node 102, and serially-coupled diodes D2 and D1 are coupled between the first input of minimum selection 804 and first node 102. The capacitors C1 and C2 are used to block the AC voltage across the above-discussed control circuitry in the RF operating mode. Capacitor C1 is coupled to a high bias voltage source at node 110 through resistor RGESD1, and capacitor C2 is coupled to a low bias voltage source at node 108 through resistor RGESD2.

The voltages at the labeled nodes in each of four operating modes (negative ESD event, positive ESD event, switch in OFF state, and switch in ON state, are listed in the table below. The voltages in the active modes (i.e. switch OFF state and switch ON state) refer to the DC bias voltages at the respective nodes.

|  | Negative ESD | Positive ESD | Switch OFF state | Switch ON state |
| --- | --- | --- | --- | --- |
| $V_{FEED}$ | Negative | Positive | 0 V | 0 V |
| $V_{LOW}$ | 0 V | 0 V | negative | negative |
| $V_{HIGH}$ | 0 V | 0 V | positive | positive |
| $V_{CTRL}$ | 0 V | 0 V | negative | positive |
| $v_t$ | $V_{FEED}$ | $V_{FEED} - 2*V_d$ | 0 V | 0 V |
| $v_{ds}$ | negative | positive | positive | negative |
| $v_{gs}$ | 0 V | negative | positive | 0 V |
| $v_{gd}$ | positive | negative | 0 V | positive |
| $M_{ESD}$ | OFF | ON | OFF | OFF |

As set forth in the above table, PMOS transistor MESD is ON if either one of Vgs or Vgd is negative, and PMOS transistor MESD is OFF if both Vgs and Vgd are zero or positive.

Figure 10A:
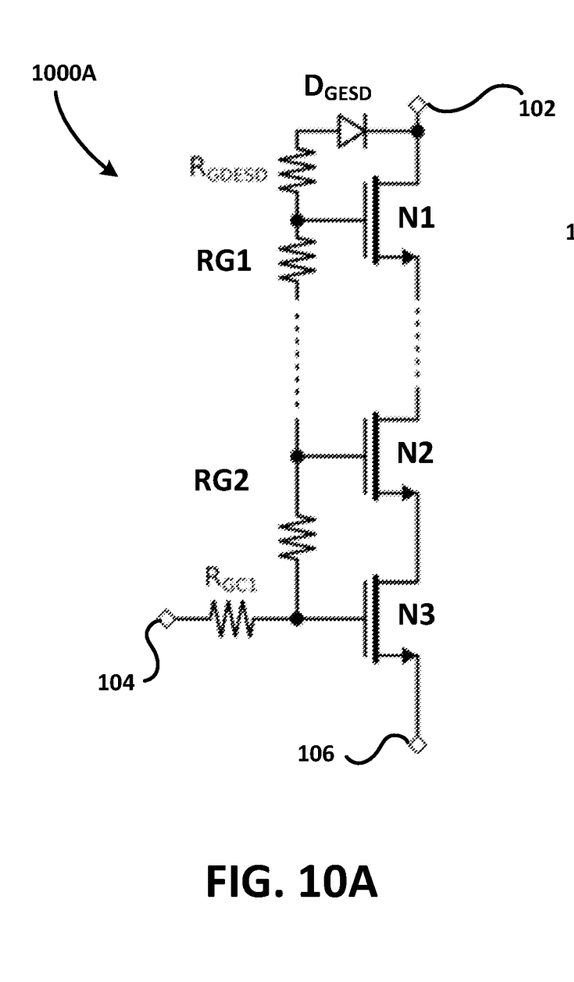
FIG. 10A is a schematic diagram of an RF switch with improved ESD robustness including a diode circuit in series with an ESD protection circuit, according to an embodiment.

FIG. 10A is a schematic diagram of an RF switch 1000A with improved ESD robustness including a diode circuit (diode $D_{GESD}$) in series with an ESD protection circuit (resistor $R_{GDESD}$), according to an embodiment. RF switch 1000A includes other elements and nodes previously described with respect to FIG. 4, for example.

During a positive ESD pulse across the stack of transistors in RF switch 1000A, the drain-gate voltage at the top switch transistor (transistor N1) gradually increases as the parasitic capacitances of the transistors are discharged through the gate biasing network (resistors RG1, RG2, and RGC1). When the drain-gate reaches the level of the reverse breakdown of the diode $D_{GESD}$, the diode opens and limits the further increase of the drain-gate voltage, thus protecting the transistor N1 from damage. During a negative ESD pulse across the stack of transistors of RF switch 1000A, the diode $R_{GDESD}$ opens up once the voltage across it reaches the forward-biased voltage (or around 0.6V for a silicon diode). In the RF operation mode on OFF-state of the RF switch 1000A the diode remains always in reverse-biased mode. The structure of RF switch 1000A is not appropriate for ON mode operation.

Figure 10B:
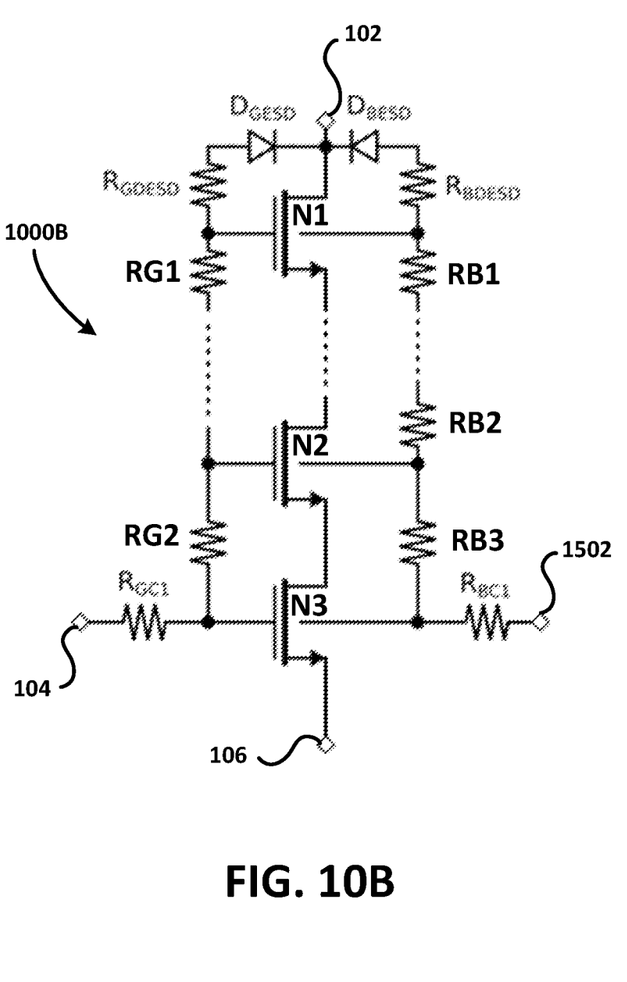
FIG. 10B is a schematic diagram of an RF switch with improved ESD robustness including a first diode circuit in series with a first ESD protection circuit and a second diode circuit in series with a second ESD protection circuit, according to an embodiment.

FIG. 10B is a schematic diagram of an RF switch 1000B with improved ESD robustness including a first diode circuit (diode $D_{GESD}$) in series with a first ESD protection circuit (resistor $R_{GDESD}$) and a second diode circuit (diode $D_{BESD}$) in series with a second ESD protection circuit (resistor $R_{BDESD}$), according to an embodiment. RF switch 1000B operates in a similar fashion to that of RF switch 1000A. The second diode circuit and second ESD protection circuit are provided to a set of bulk (or body) resistors coupled to the bulk (or body) node of transistors N1, N2, and N3. For example, bulk resistor RB1 is coupled to the bulk node of transistor N1, bulk resistor is coupled to the bulk node of transistor RB2, and bulk resistor RB3 is coupled to the bulk node of transistor RB3. The number of bulk resistors is equal to the number of transistors in the stack of transistors in RF switch 1000B. Resistor $R_{BC1}$ is coupled between the bulk node transistor N3 and node 1502. In some embodiments, third node 104 and node 1502 are coupled together to receive a control signal to place RF switch 1000B into the ON mode or the OFF mode.

Figure 11A:
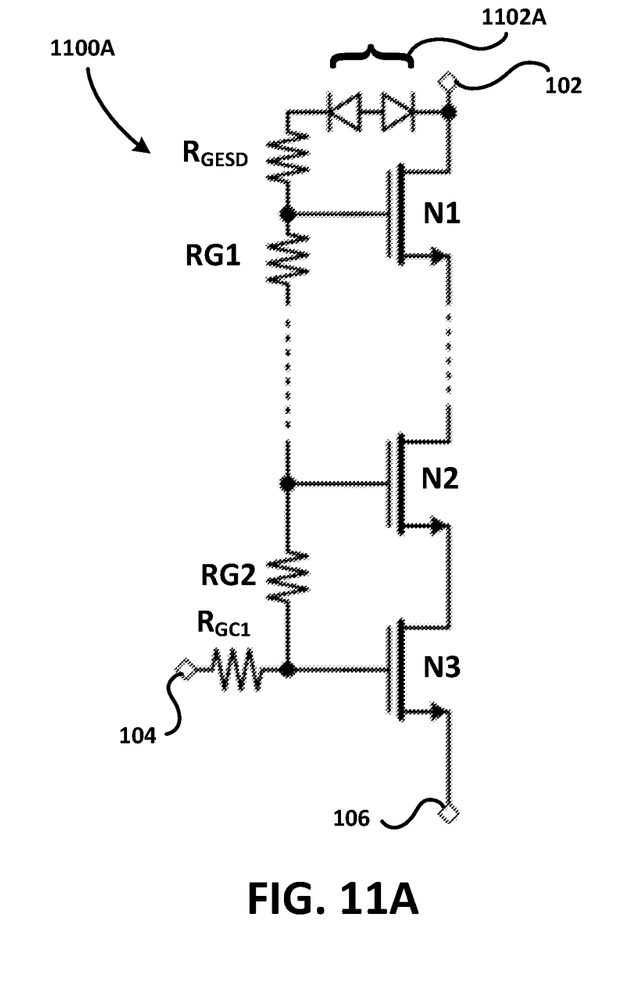
FIG. 11A is a schematic diagram of an RF switch with improved ESD robustness including an anti-series diode network, according to a first embodiment.

FIG. 11A is a schematic diagram of an RF switch 1100A with improved ESD robustness including an anti-series diode network 1102A, according to a first embodiment. RF switch 1100A has a schematic similar to that of RF switch 1000A, previously described, wherein the single diode circuit $D_{GESD}$ is replaced with the anti-series diode network 1102A. The RF switches shown in FIG. 11A and FIG. 11B (described below in further detail) are capable of operation in both ON and OFF-modes of operation. The anti-series diode network 1102A bypasses the current when the applied voltage reaches:

$$|Vlimit|=|Vrev.bd+Vfwd|,$$

wherein Vrev.bd is the reverse breakdown voltage of the diode, and Vfwd is the forward-bias voltage of the diode. The anti-series diode network 1102A protects the gate-drain branch of transistor N1 from ESD overvoltage for both positive and negative pulses. In RF operation mode, the bias voltages for the RF switch 1100A in OFF and ON states are below the |Vlimit| voltage, such that the anti-series diode network 1102A does not bypass any current.

Figure 11B:
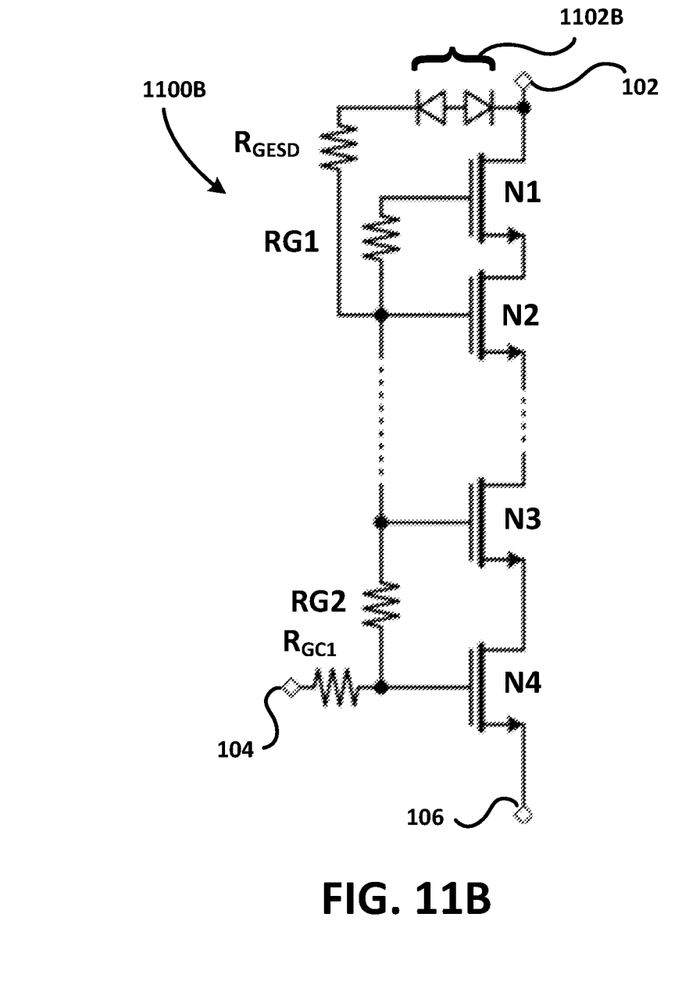
FIG. 11B is a schematic diagram of an RF switch with improved ESD robustness including an anti-series diode network, according to a second embodiment.

FIG. 11B is a schematic diagram of an RF switch 1100B with improved ESD robustness including an anti-series diode network 1102B, according to a second embodiment. In the embodiment shown in FIG. 11B, the anti-series diode network 1102B is tapped to the gate of the second (or further) transistor N2 in the stack of transistors, which increases the voltage drop over the diode network in the ESD case and improves the protection of the switch.

Figure 12A:
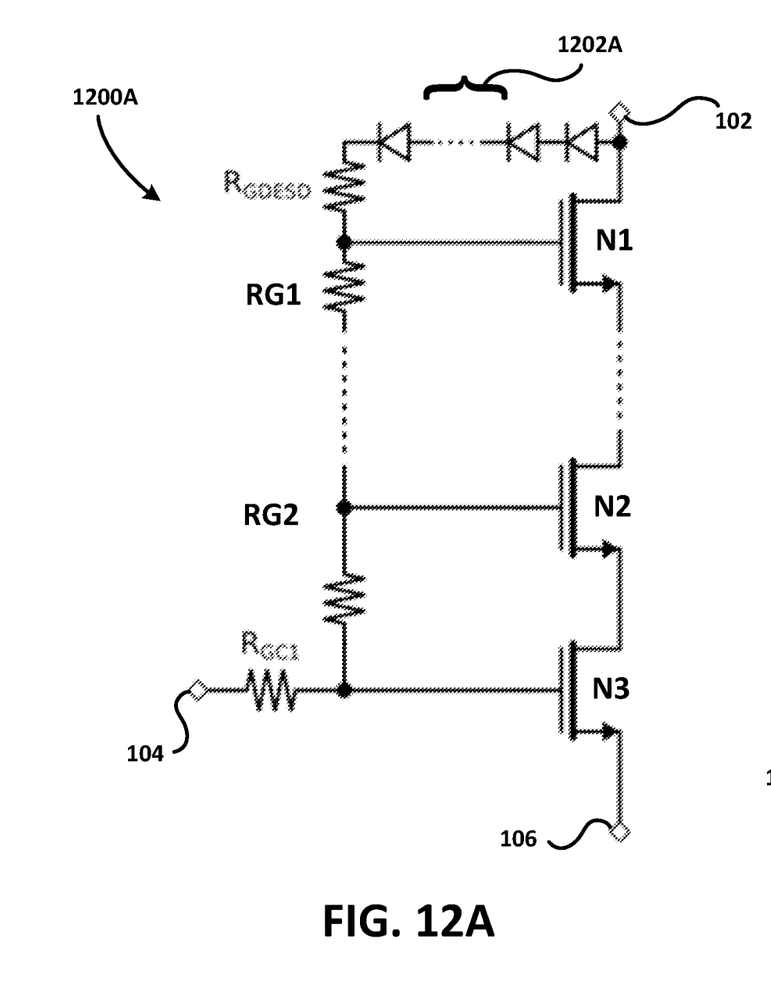
FIG. 12A is a schematic diagram of an RF switch with improved ESD robustness including a multiple diode network, according to a first embodiment.

FIG. 12A is a schematic diagram of an RF switch 1200A with improved ESD robustness including a multiple diode network 1202A, according to a first embodiment. RF switch 1200A has a schematic similar to that of RF switch 1000A, previously described, wherein the single diode circuit $D_{GESD}$ is replaced with the multiple diode network 1202A. Multiple diode network 1202A comprises a plurality of serially coupled diodes. The anode of a first diode is coupled to first node 102 of RF switch 1200A, and the cathode of a last diode is coupled to a first end of resistor $R_{GDESD}$ in an embodiment. While only three serially coupled diodes are shown in FIG. 12A, any number may be used.

Figure 12B:
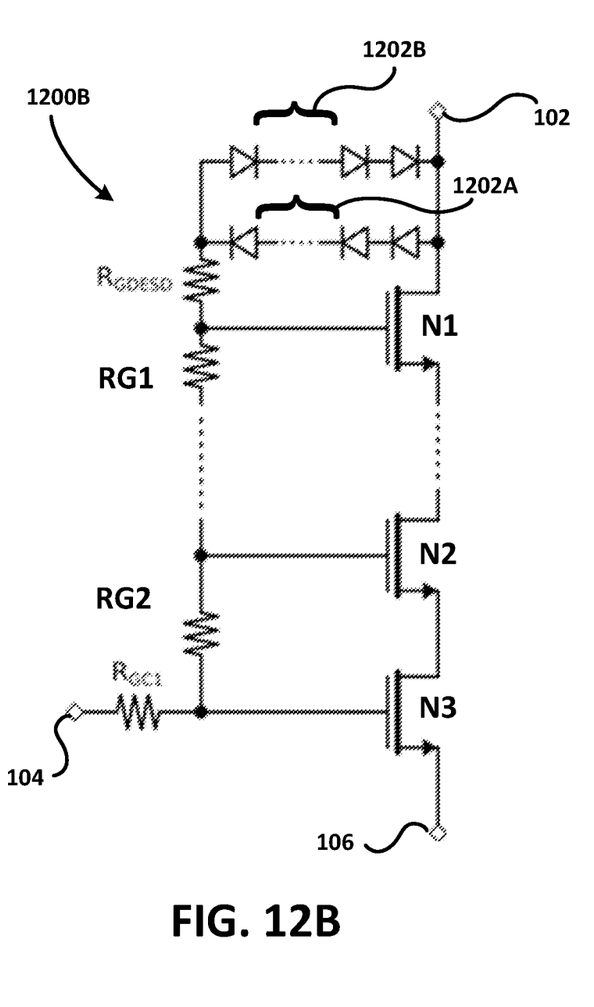
FIG. 12B is a schematic diagram of an RF switch with improved ESD robustness including a multiple diode network, according to a second embodiment.

FIG. 12B is a schematic diagram of an RF switch 1200B with improved ESD robustness including multiple diode network 1202A and an additional multiple diode network 1202B, according to a second embodiment. RF switch 1100A has a schematic similar to that of RF switch 1000A, previously described, wherein the single diode circuit $D_{GESD}$ is replaced with the multiple diode networks 1202A and 1202B. Multiple diode networks are coupled in an anti-parallel configuration. In other words, the anode of a first diode of multiple diode network 1202A is coupled to first node 102, and the cathode of a first diode of multiple diode network 1202B is coupled to first node 102. The cathode of a last diode in multiple diode network 1202A is coupled to a first end of resistor $R_{GDESD}$ in an embodiment, and the anode of a last diode in multiple diode network 1202B is coupled to the first end of resistor $R_{GDESD}$ in an embodiment.

The structure of RF switch 1200B is beneficial if the diode reverse breakdown voltage Vrev.bd is too high for limiting the gate-drain voltage. The anti-parallel diode network bypasses the current when the applied voltage reaches:

$$|Vlimit|=n*Vfwd,$$

where "n" is the total number of diodes coupled in series. The operation in the ESD case and RF mode is similar to the operation of the RF switches shown in FIG. 10A and FIG. 11A.

Figure 13:
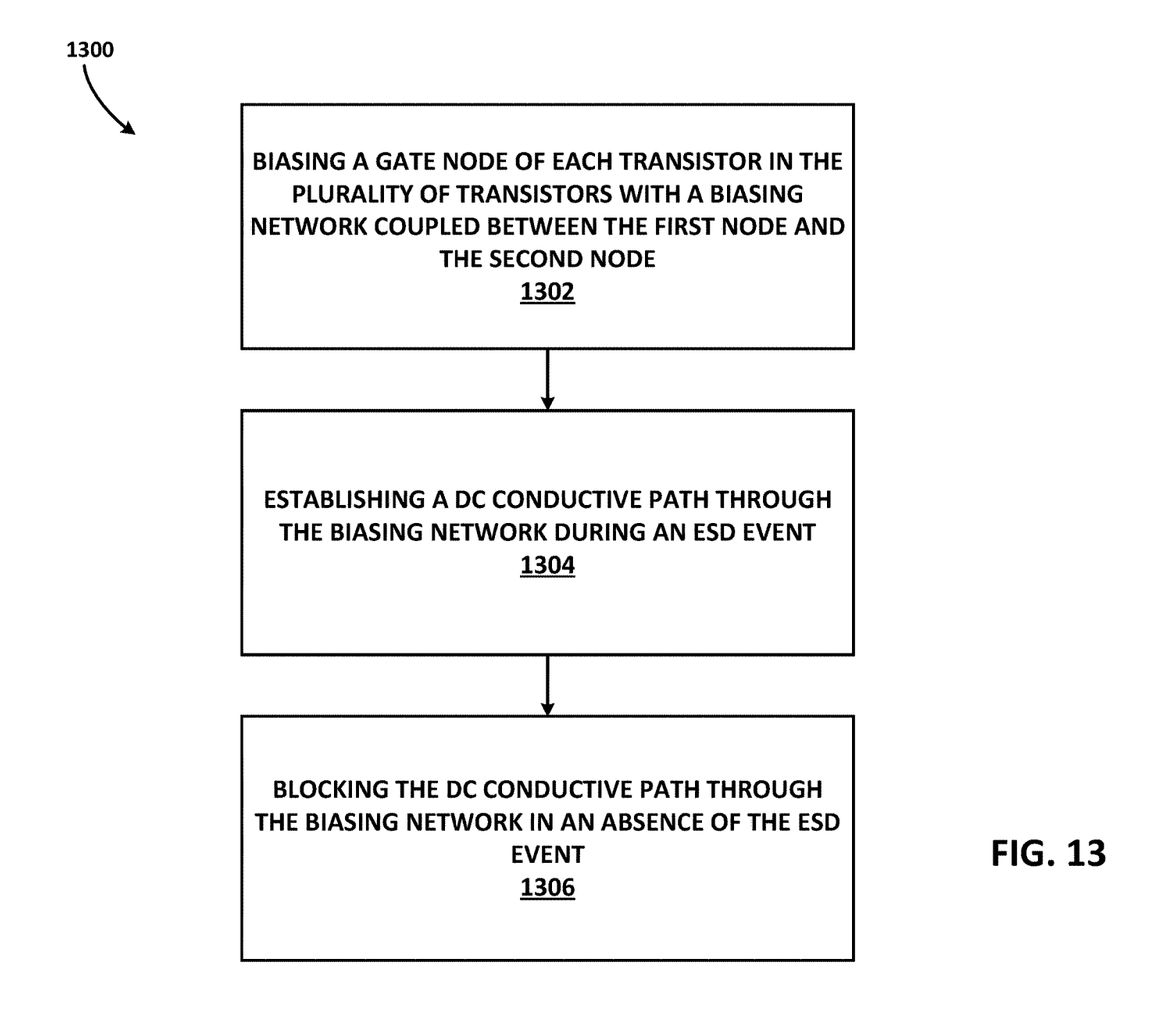
FIG. 13 is flowchart of a method of operating an RF switch, according to an embodiment.

A flowchart of a method 1300 of operating an RF switch comprising a plurality of transistors coupled between a first node and a second node is shown in FIG. 13, according to an embodiment. The method comprises biasing a control node of each transistor in the plurality of transistors with a biasing network coupled between the first node and the second node at step 1302; establishing a DC conductive path through the biasing network during an ESD event at step 1304; and blocking the DC conductive path through the biasing network in an absence of the ESD event at step 1306.

In summary, stacked MOSFET RF switch embodiments have been described and shown with improved robustness against ESD events. The RF switches described herein can be fabricated in a single RF switch product including a one or more switches. Alternatively, the RF switches described herein can be embedded in other integrated circuit products including additional electrical components. The number of transistors and biasing resistors shown in the drawing figures are for illustration purposes only and can be changed to include additional transistors and biasing resistors to meet high voltage specifications in particular applications. RF switch embodiments shown in a drawing figure can be combined with RF switch embodiments shown in another drawing figure to create another embodiment. The transistor type and polarity can be changed as desired to accommodate particular applications.

Example embodiments of the present invention are summarized here. Other embodiments can also be understood from the entirety of the specification and the claims filed herein.

Example 1. According to an embodiment, an RF switch device includes a plurality of transistors coupled in series forming an RF conductive current path; a first resistive bias network forming a DC conductive bias path between gate nodes of the plurality of transistors; and a first ESD bias component coupled between the RF conductive current path and the first resistive bias network, wherein the first ESD bias component is configured to provide a DC conductive path between the RF conductive current path of the RF switch device and the first resistive bias network during an ESD event.

Example 2. The RF switch device of Example 1, wherein the first ESD bias component is coupled between a first node of the RF switch device and a gate node of a first transistor of the plurality of transistors.

Example 3. The RF switch device of any of the above examples, wherein the first ESD bias component includes a first resistor.

Example 4. The RF switch device of any of the above examples, wherein the first ESD bias component further includes a switching transistor in series with the first resistor.

Example 5. The RF switch device of any of the above examples, wherein the gate node of the first transistor is coupled to a controlled node of switching transistor, wherein the controlled node of the switching transistor comprises a source node or a drain node.

Example 6. The RF switch device of any of the above examples, wherein the gate node of the first transistor is coupled to a gate node of an Nth transistor in the plurality of transistors, wherein "N" is an integer greater than one.

Example 7. The RF switch device of any of the above examples, further including a maximum voltage circuit having a first input coupled to the first ESD bias component, a second input coupled to the RF conductive current path, and an output coupled to the gate node of the switching transistor.

Example 8. The RF switch device of any of the above examples, wherein the maximum voltage circuit is configured to provide a voltage at the output that is a maximum between a voltage at the first input and a voltage at the second input.

Example 9. The RF switch device of any of the above examples, further including a maximum voltage circuit having a first input coupled to the first ESD bias component, a second input, and an output coupled to a control node of the transistor; and a minimum voltage circuit having a first input coupled to a bias voltage source, a second input coupled to a first node of the RF switch device, and an output coupled to the second input of the maximum voltage circuit.

Example 10. The RF switch device of any of the above examples, wherein the maximum voltage circuit is configured to provide a voltage at the output that is a maximum between a voltage at the first input and a voltage at the second input, and wherein the minimum voltage circuit is configured to provide a voltage at the output that is a minimum between a voltage at the first input and a voltage at the second input.

Example 11. The RF switch device of any of the above examples, wherein a second ESD bias component is coupled between a second node of the RF switch device and a control node of a last transistor in the plurality of transistors.

Example 12. The RF switch device of any of the above examples, wherein the second ESD bias component includes a second resistor.

Example 13. The RF switch device of any of the above examples, wherein the first ESD bias component further includes a diode in series with the first resistor.

Example 14. The RF switch device of any of the above examples, wherein the first ESD bias component includes two diodes in anti-serial combination in series with the first resistor.

Example 15. The RF switch device of any of the above examples, wherein the first ESD bias component includes a plurality of diodes in series with the first resistor.

Example 16. The RF switch device of any of the above examples, wherein the first ESD bias component includes a first plurality of diodes in a first series configuration coupled to the first resistor, and a second plurality of diodes in a second series configuration coupled to the first resistor.

Example 17. The RF switch device of any of the above examples, further including a second resistive bias network forming a DC conductive bias path between bulk nodes of the plurality of transistors; and a second ESD bias component coupled between the RF conductive current path and the second resistive bias network, wherein the second ESD bias component is configured to provide a DC conductive path between the RF conductive current path of the RF switch device and the second resistive bias network during an ESD event.

Example 18. The RF switch device of any of the above examples, wherein the second ESD bias component includes a resistor in series with a diode.

Example 19. According to an embodiment, an RF switch includes a plurality of transistors coupled in series forming an RF conductive current path between a first node and a second node; and an ESD and biasing network coupled to the first node, the second node, and to a plurality of gate nodes of the plurality of transistors in the RF conductive current path, wherein the ESD and biasing network is configured to provide a DC conductive path between the first node and the second node during an ESD event, and to block a DC conductive path between the first node and the second node in an absence of an ESD event.

Example 20. According to an embodiment, a method of operating an RF switch including a plurality of transistors coupled between a first node and a second node, the method including biasing a gate node of each transistor in the plurality of transistors with a biasing network coupled between the first node and the second node; establishing a DC conductive path through the biasing network during an ESD event; and blocking the DC conductive path through the biasing network in an absence of the ESD event.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An RF switch device, comprising:
   a plurality of transistors coupled in series forming an RF conductive current path;
   a first resistive bias network forming a DC conductive bias path between gate nodes of the plurality of transistors; and
   a first ESD bias component coupled between the RF conductive current path and the first resistive bias network, wherein the first ESD bias component is configured to provide a DC conductive path between the RF conductive current path of the RF switch device and the first resistive bias network during an ESD event, wherein the first ESD bias component comprises a switching transistor.

2. The RF switch device of claim 1, wherein the first ESD bias component is coupled between a first node of the RF switch device and a gate node of a first transistor of the plurality of transistors.

3. The RF switch device of claim 2, wherein the first ESD bias component comprises a first resistor.

4. The RF switch device of claim 3, wherein the gate node of the switching transistor is coupled to a controlled node of the first transistor of the plurality of transistors, wherein the controlled node of the first transistor comprises a source node or a drain node.

5. The RF switch device of claim 3, wherein the gate node of the switching transistor is coupled to a source node or a drain node of an Nth transistor in the plurality of transistors, wherein "N" is an integer greater than one.

6. The RF switch device of claim 3, further comprising a maximum voltage circuit having a first input coupled to the first ESD bias component, a second input coupled to the RF conductive current path, and an output coupled to the gate node of the switching transistor.

7. The RF switch device of claim 6, wherein the maximum voltage circuit is configured to provide a voltage at the output that is a maximum between a voltage at the first input and a voltage at the second input.

8. The RF switch device of claim 3, further comprising:
   a maximum voltage circuit having a first input coupled to the first ESD bias component, a second input, and an output coupled to the gate node of the switching transistor; and
   a minimum voltage circuit having a first input coupled to a bias voltage source, a second input coupled to the first node of the RF switch device, and an output coupled to the second input of the maximum voltage circuit.

9. The RF switch device of claim 8,
   wherein the maximum voltage circuit is configured to provide a voltage at the output of the maximum voltage circuit that is a maximum between a voltage at the first input of the maximum voltage circuit and a voltage at the second input of the maximum voltage circuit, and wherein the minimum voltage circuit is configured to provide a voltage at the output of the minimum voltage circuit that is a minimum between a voltage at the first input of the minimum voltage circuit and a voltage at the second input of the minimum voltage circuit.

10. The RF switch device of claim 2, wherein a second ESD bias component is coupled between a second node of the RF switch device and a gate node of a last transistor in the plurality of transistors.

11. The RF switch device of claim 10, wherein the second ESD bias component comprises a second resistor.

12. The RF switch device of claim 3, wherein the first ESD bias component further comprises a diode in series with the first resistor.

13. The RF switch device of claim 3, wherein the first ESD bias component comprises two diodes in anti-serial combination in series with the first resistor.

14. The RF switch device of claim 3, wherein the first ESD bias component comprises a plurality of diodes in series with the first resistor.

15. The RF switch device of claim 3, wherein the first ESD bias component comprises a first plurality of diodes in a first series configuration coupled to the first resistor, and a second plurality of diodes in a second series configuration coupled to the first resistor.

16. The RF switch device of claim 1, further comprising:
a second resistive bias network forming a DC conductive bias path between bulk nodes of the plurality of transistors; and
a second ESD bias component coupled between the RF conductive current path and the second resistive bias network, wherein the second ESD bias component is configured to provide a DC conductive path between the RF conductive current path of the RF switch device and the second resistive bias network during the ESD event.

17. The RF switch device of claim 16, wherein the second ESD bias component comprises a resistor in series with a diode.

18. An RF switch, comprising:
a plurality of transistors coupled in series forming an RF conductive current path between a first node and a second node; and
an ESD and biasing network coupled to the first node, the second node, and to a plurality of gate nodes of the plurality of transistors in the RF conductive current path, wherein the ESD and biasing network comprises a switching transistor,
wherein the ESD and biasing network is configured to provide a DC conductive path between the first node and the second node during an ESD event, and to block the DC conductive path between the first node and the second node in an absence of the ESD event.

19. A method of operating an RF switch comprising a plurality of transistors coupled between a first node and a second node, the method comprising:
biasing a gate node of each transistor in the plurality of transistors with a biasing network comprising a switching transistor coupled between the first node and the second node;
establishing a DC conductive path through the biasing network during an ESD event; and
blocking the DC conductive path through the biasing network in an absence of the ESD event.

* * * * *